United States Patent
Lee et al.

(10) Patent No.: US 6,171,938 B1
(45) Date of Patent: Jan. 9, 2001

(54) METHOD FOR FABRICATING SEMICONDUCTOR DEVICE CAPABLE OF MINIMIZING DAMAGE OF LOWER LAYER USING INSULATING LAYER RESIDED IN OPENING

(75) Inventors: Ki Yeup Lee; Jeong Woo Ha, both of Ichon-shi (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/342,093

(22) Filed: Jun. 29, 1999

(30) Foreign Application Priority Data

Jun. 30, 1998 (KR) .................................. 98-25227

(51) Int. Cl.⁷ ................................................ H01L 21/4763
(52) U.S. Cl. ......................... 438/585; 438/667; 438/963
(58) Field of Search ..................... 438/197, 585, 438/586, 587, 515, 667, 963

(56) References Cited

U.S. PATENT DOCUMENTS

| 4,430,152 | * | 2/1984 | Okabo ................................ 156/643 |
| 5,441,594 | * | 8/1995 | Zenke ................................ 156/643.1 |
| 5,545,578 | | 8/1996 | Park et al. . |
| 5,562,801 | * | 10/1996 | Nulty ................................ 156/643.1 |
| 5,620,914 | | 4/1997 | Hikida et al. . |
| 5,766,998 | | 6/1998 | Tseng . |
| 5,773,348 | | 6/1998 | Wu . |
| 5,789,140 | * | 8/1998 | Chou et al. ........................ 430/296 |
| 5,940,726 | * | 8/1999 | Yu .................................... 438/597 |
| 5,998,285 | * | 12/1999 | Chou ................................ 438/585 |

FOREIGN PATENT DOCUMENTS

| 64-25474 | 1/1989 | (JP) . |
| 3-104125 | 5/1991 | (JP) . |
| 3-285334 | 12/1991 | (JP) . |
| 4-186778 | 7/1992 | (JP) . |
| 4-277617 | 10/1992 | (JP) . |

* cited by examiner

Primary Examiner—Trung Dang
(74) Attorney, Agent, or Firm—Jacobson, Price, Holman & Stern, PLLC

(57) ABSTRACT

The present invention is to provide a method for fabricating a semiconductor device, including the steps of: (a) forming an insulating layer on a semiconductor substrate; (b) selectively removing the insulating layer and then forming an opening and the residual insulating layer on a bottom of the opening; (c) removing the residual insulating layer by wet etching in order to expose the semiconductor substrate; and (d) burying a conductive layer in the opening and then forming a conductive layer pattern connected to the semiconductor substrate.

14 Claims, 4 Drawing Sheets

METHOD FOR FABRICATING SEMICONDUCTOR DEVICE CAPABLE OF MINIMIZING DAMAGE OF LOWER LAYER USING INSULATING LAYER RESIDED IN OPENING

FIELD OF THE INVENTION

The present invention relates to a semiconductor device; and, more particularly, to a method for fabricating a semiconductor device capable of minimizing damage of a lower layer using an insulating layer resided in an opening.

DESCRIPTION OF THE PRIOR ART

A process for forming a gate, which has line width of less than 0.3 μm, may cause many problems. For example, in case where etching selectivity of a conductive layer with respect to a photoresist pattern is not high, notching or collapse of the conductive layer may occur. When an etching process is applied at the state that a sidewall passivation of a pattern is not complete, pattern sidewalls may be undesirably etched. Also, when the over-etching conditions for removing a residual material are not appropriate, the residual material may not be completely removed. When a gate oxide layer is exposed by the etching process which forms a gate on the gate oxide layer, a plasma current occurs on the conductive layer to be floated, thereby degrading characteristics of the gate oxide layer.

At the time of etching a metal layer and forming the gate, high bias power is applied to a silicon substrate, so that the etching selectivity of the metal layer with respect to another layer beneath the metal layer becomes low. Particularly, when source and drain regions are damaged by the etching process for exposing the silicon substrate, there is a problem that operation characteristics of a semiconductor device are degraded.

SUMMARY OF THE INVENTION

It is, therefore, an object of the present invention to provide a method for fabricating a semiconductor device which easily forms a pattern of a highly integrated semiconductor device.

It is another object of the present invention to provide a method for fabricating a semiconductor device which prevents damage of a lower layer in an etching process for forming a pattern.

In accordance with an aspect of the present invention, there is provided a method for fabricating a semiconductor device, comprising the steps of: (a) forming an insulating layer on a semiconductor substrate; (b) selectively removing the insulating layer and then forming a first opening and the residual insulating layer on a bottom of the first opening; (c) removing the residual insulating layer by wet etching in order to expose the semiconductor substrate; and (d) burying a conductive layer in the first opening and then forming a conductive layer pattern connected to the semiconductor substrate.

In accordance with another aspect of the present invention, there is provided a method for fabricating a semiconductor device, comprising the steps of: (a) forming sacrificial oxide, etch stop, oxide and antireflection layers on a semiconductor substrate; (b) forming a mask on the antireflection layer; (c) selectively removing the antireflection and oxide layers and forming an opening to expose the etch stop layer; (d) removing the mask; (e) removing the etch stop layer exposed on a bottom of the opening in order to expose the sacrificial oxide layer; (f) removing the sacrificial oxide layer by wet etching in order to expose the semiconductor substrate; (g) forming a gate oxide layer on the exposed semiconductor substrate; and (h) burying a conductive layer in the opening and forming a gate electrode.

BRIEF DESCRIPTION OF THE DRAWINGS

Other objects and aspects of the invention will become apparent from the following description of the embodiments with reference to the accompanying drawings, in which.

DETAILED DESCRIPTION OF THE INVENTION

Hereafter, the present invention will be described in detail with reference to the accompanying drawings.

Referring to FIGS. 1A to 1E, a method for fabricating a semiconductor device according to an embodiment may easily form a pattern of a highly integrated semiconductor device and prevent damage of a lower layer in an etching process for forming the pattern.

Figure 1A:
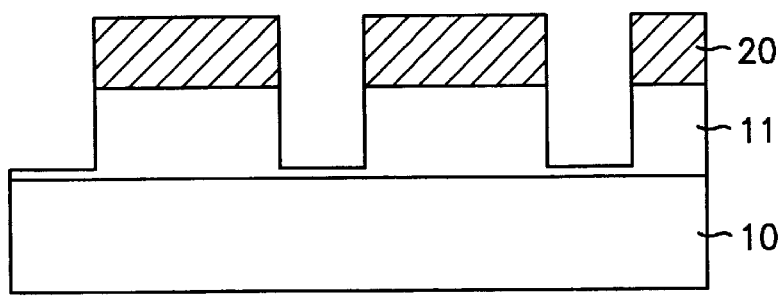
FIGS. 1A to 1E are cross-sectional views illustrating a method for fabricating a semiconductor device according to an embodiment of the present invention.

Referring to FIG. 1A, an oxide layer 11 is formed on a silicon substrate 10 and then a photoresist pattern 20 to expose a gate formation region is formed. After forming the photoresist pattern 20, the oxide layer 11 is etched using the photoresist pattern 20 as a mask, so trenches are formed within the oxide layer 11 and then the residual oxide layer 11 having a thickness of 50 Å is formed on bottoms of the trenches. At this time, to improve the etching selectivity at the time of etching the oxide layer 11, etching gas of $H_2$ and $C_xF_y$, or $C_xH_yF_z$, which sufficiently generates polymer and effectively removes fluorine, is employed. Also, gas pressure of more than 10 m Torr and bias power of less than 100 W are maintained, thereby reducing an ion current an etching rate.

Figure 1B:
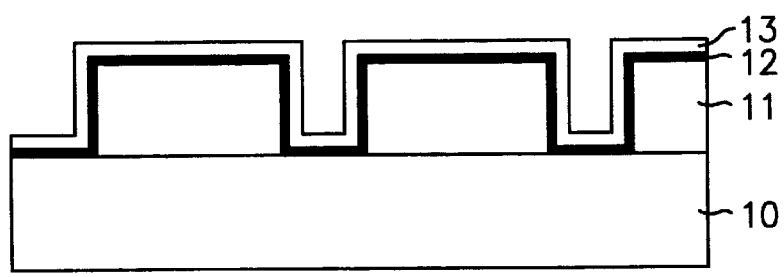

Referring to FIG. 1B, after forming the trenches, the photoresist layer 20 is removed. Then, impurities and the residual oxide layer 11 are removed by wet etching using buffered oxide etchant (BOE), HF or $NH_4OH$ in order to expose the silicon substrate 10. After removing the impurities and the residual oxide layer 11, an oxide layer 12 and a barrier metal layer 13 to be a gate oxide layer are in this order formed. At this time, an uneven surface formed on the silicon substrate by wet etching is smoothed by the formation of the oxide layer 12. That is, the oxide layer 12 having a sufficient thickness is formed on the uneven surface such that the uneven surface is covered with the oxide layer 12. Also, after forming the barrier metal layer 13, a thermal treatment is applied to the resulting structure so as to improve adhesion and release stress.

Figure 1C:
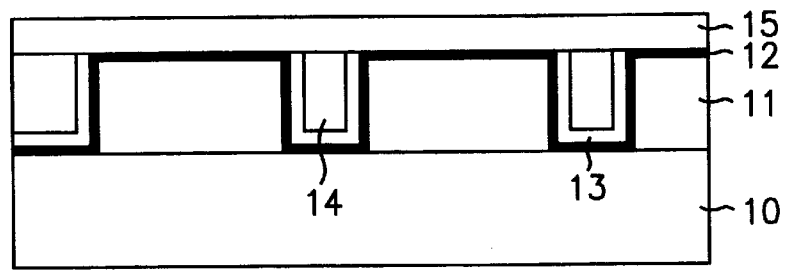

Referring to FIG. 1C, after the thermal treatment, a conductive layer 14 for a gate electrode is formed on the barrier metal layer 13, and the gage electrode is formed by etching such that the barrier metal and conductive layers 13 and 14 are buried only within the trenches. At this time, the conductive and barrier metal layers 14 and 13 outside the trenches may be removed by a chemical mechanical polishing (CMP) process. Also, since the conductive layer 14 of one trench may be connected to that of a neighboring trench by a bridge, a thickness of the conductive layer 14 buried into the trenches should not be more than that of the oxide layer 11. After forming the gate electrode, an interlayer insulating layer 15 as a nitride or oxide layer is formed on the resulting structure.

Figure 1D:
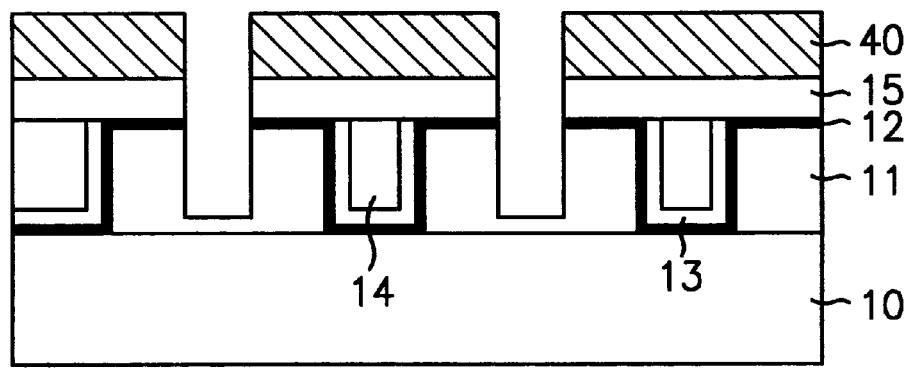

Referring to FIG. 1D, after forming the interlayer insulating layer 15, a photoresist pattern 40 to expose a contact hole formation region is formed on the interlayer insulating layer 15. After forming the photoresist pattern 40, the interlayer insulating and oxide layers 15, 12 and 11 are selectively etched using the photoresist pattern 40 as a mask, so contact holes are formed within the oxide layer 11 and then the residual oxide layer 11 having a thickness of approximately 50 Å is formed on bottoms of the contact holes. The residual oxide layer 11 may be employed as a buffer layer to reduce plug contact resistance at the time of implanting impurities. At the time of etching the oxide layer 11, etching gas of $H_2$ and $C_xF_y$, or $C_xH_yF_z$ is employed. Also, the gas pressure of 7 m to 12 m Torr and the bias power of less than 200 W are maintained, thereby reducing an ion current an etching rate.

Figure 1E:
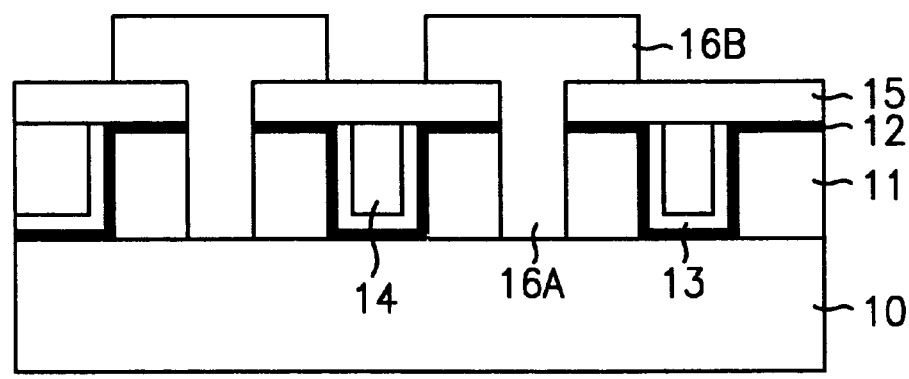

Referring to FIG. 1E, after forming the contact holes, the photoresist pattern 40 is removed. Then, the residual oxide layer 11 is removed by a cleaning process using buffered oxide etchant (BOE), HF or $NH_4OH$ in order to expose the silicon substrate 10. After removing the residual oxide layer 11, a conductive layer is deposited and patterned, and a contact plug 16A and a plug pad 16B are formed.

Referring to FIGS. 2A to 2F, a method for fabricating a semiconductor device according to another embodiment may easily form a pattern of a highly integrated semiconductor device and prevent damage of a lower layer in an etching process for forming the pattern.

Figure 2A:
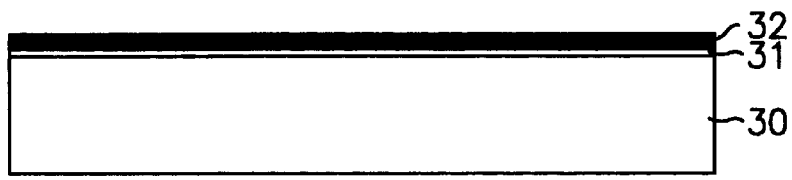
FIGS. 2A to 2F are cross-sectional views illustrating a method for fabricating a semiconductor device according to another embodiment of the present invention.

Referring to FIG. 2A, sacrificial oxide and etch stop layers 31 and 32 are in this order formed on a silicon substrate 30. At this time, the sacrificial oxide layer 31 has a thickness of 40 to 50 Å and may become a natural or artificial oxide layer. The natural or artificial oxide layer does not damage a silicon substrate and the natural oxide layer may remove a damaged layer and residual impurities. The etch stop layer 32 is composed of a material having low reflection factor such that the sacrificial oxide layer 31 and the silicon substrate 30 are not damaged by plasma at the time of patterning an oxide layer.

Figure 2B:
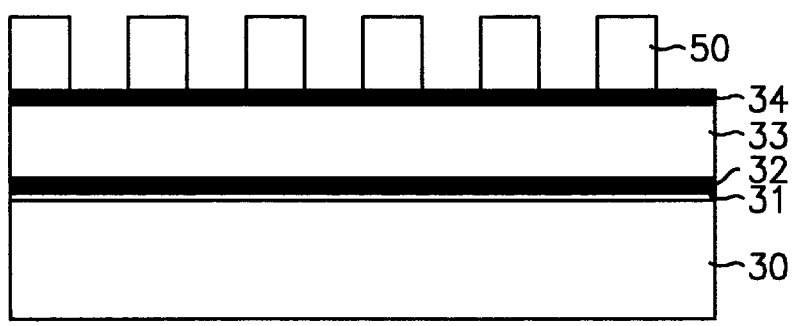

Referring to FIG. 2B, after forming the etch stop layer 32, an oxide layer 33 having the same height as a gate is formed on the etch stop layer 32 and then an antireflection layer 34 is formed on the oxide layer 33. After forming the antireflection layer 34, a photoresist pattern 50 to expose a gate formation region is formed on the antireflection layer 34.

Figure 2C:
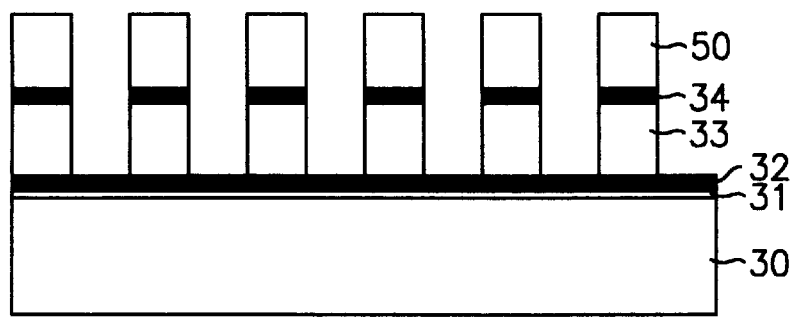

Referring to FIG. 2C, after forming the photoresist pattern 50, the antireflection and oxide layers 34 and 33 are selectively etched using the photoresist pattern 50 as a mask, so trenches, which define gate regions, are formed in the oxide layer 33, exposing the etch stop layer 32. At the time of etching the oxide layer 33, gas containing C, H and F is employed, and gas pressure of less than 50 m Torr and bias power of less than 400 W are maintained. Since polymer is generated in case where $C_xH_yF_z$ gas is employed, and etching speed is slow and etching is stopped in case where a lower layer appears on the way of etching, the lower layer may be protected.

Figure 2D:
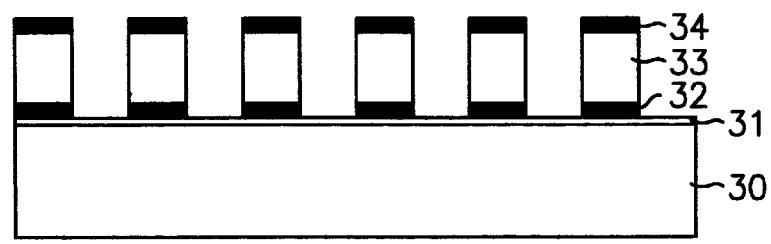

Referring to FIG. 2D, after forming the trenches, the photoresist layer 50 is removed and then the etch stop layer 32 to expose the sacrificial oxide layer 31 of the gate formation region is selectively etched. In order to compensate the oxide layer 33 damaged by impurity ions and a radical of the photoresist pattern 50 and improve etching selectivity for the sacrificial oxide layer 31, etching gas of $Cl_2$ and $O_2$ is employed and the bias power of less than 50 W is applied to the semiconductor substrate at the time of etching the etch stop layer 32. Then, an amount of $Cl_2$ is in a range of 10 to 17 sccm and the etching selectivity of the etch stop layer 32 to the sacrificial oxide layer 31 is from 50:1 to 80:1.

Figure 2E:
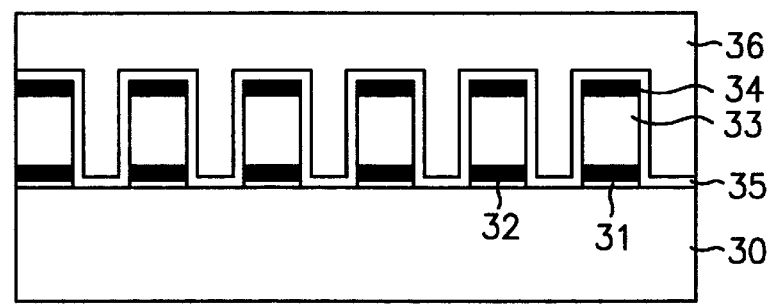

Referring to FIG. 2E, an oxide layer (not shown) having a thickness of 100 Å is formed on the resulting structure in order to remove a residual material. After forming the oxide layer, the sacrificial oxide layer 31 exposed on the oxide layer and a gate formation electrode is removed by a cleaning process and then a gate oxide layer 35 and a conductive layer 36 for a gate electrode are formed.

Figure 2F:
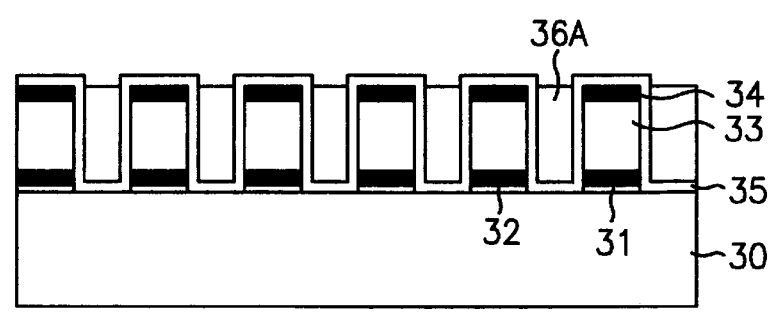

Referring to FIG. 2F, after forming the conductive layer 36, an etch back or chemical mechanical polishing (CMP) process is applied to the conductive layer 36 and then the gate electrodes 36A are formed.

Accordingly, the method of the present invention may easily form a conductive layer pattern of the semiconductor device by forming the opening such as the trench or the contact hole and burying the conductive layer within the opening. Also, the method of the present invention may prevent the degradation of characteristics of the semiconductor device by removing the residual material using the wet etching.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, comprising:
    (a) forming an insulating layer on a semiconductor substrate;
    (b) selectively removing the insulating layer to thereby form a first opening in the insulating layer and a residual insulating layer between a bottom of the first opening and the semiconductor substrate;
    (c) removing the residual insulating layer by wet etching in order to expose the semiconductor substrate;
    (d) forming a gate oxide layer in the first opening; and
    (e) burying a conductive layer on the gage oxide layer in the first opening and then forming a conductive layer pattern connected to the semiconductor substrate.

2. The method as recited in claim 1, wherein the method further comprises the steps of:
    forming an interlayer insulating layer on the resulting structure;
    selectively removing the interlayer insulating layer and the insulating layer and then forming a second opening and the residual insulating layer on a bottom of the second opening;
    removing the residual insulating layer by the wet etching in order to expose the semiconductor substrate; and
    burying the conductive layer in the second opening and forming for the conductive layer pattern connected to the semiconductor substrate.

3. The method as recited in claim 2, wherein the conductive layer in the first opening is for a gate electrode and the conductive layer in the second opening is for a contact plug.

4. The method as recited in claim 2, wherein the insulating layer is an oxide layer and the interlayer insulating layer is one of the oxide layer and a nitride layer.

5. The method as recited in claim 2, wherein the wet etching employs one of buffered oxide etchant (BOE), HF and $NH_4OH$.

6. The method as recited in claim 2, wherein the residual insulating layer has a thickness of 50 Å substantially.

7. The method as recited in claim 2, wherein the step (c) further comprises the step of forming a gate oxide layer on the exposed semiconductor substrate.

8. The method as recited in claim 7, wherein the method further comprises the steps of:

forming a barrier metal layer on the gate oxide layer; and applying a thermal treatment to the barrier metal layer.

9. A method for fabricating a semiconductor device, comprising the steps of:

(a) forming sacrificial oxide, etch stop, oxide and antireflection layers on a semiconductor substrate;

(b) forming a mask on the antireflection layer;

(c) selectively removing the antireflection and oxide layers and forming an opening to expose the etch stop layer;

(d) removing the mask;

(e) removing the etch stop layer exposed on a bottom of the opening in order to expose the sacrificial oxide layer;

(f) removing the sacrificial oxide layer by wet etching in order to expose the semiconductor substrate;

(g) forming a gate oxide layer on the exposed semiconductor substrate; and (h) burying a conductive layer in the opening and forming a gate electrode.

10. The method as recited in claim 9, wherein the sacrificial oxide layer is a natural oxide layer having a thickness of 40 to 50 Å.

11. The method as recited in claim 9, wherein the step (e) comprises the step of removing the etch stop layer on condition that etching selectivity of the etch stop layer to the sacrificial oxide layer 31 is from 50:1 to 80:1.

12. The method as recited in claim 11, wherein the step (e) comprises the step of etching the etch stop layer by etching gas of $Cl_2$ and $O_2$, wherein an amount of $Cl_2$ is in a range of 10 to 17 sccm and applying bias power of approximately 50 W to the semiconductor substrate.

13. The method as recited in claim 11, wherein the step (d) further comprises the step of forming a thermal oxide layer having a thickness of approximately 100 Å on the resulting structure.

14. The method as recited in claim 13, wherein the step (f) comprises the step of simultaneously removing both the sacrificial and thermal oxide layers.

* * * * *